United States Patent
Cho et al.

(10) Patent No.: US 10,819,301 B2
(45) Date of Patent: Oct. 27, 2020

(54) AUDIO LOUDNESS CONTROL METHOD AND SYSTEM BASED ON SIGNAL ANALYSIS AND DEEP LEARNING

(71) Applicant: KOREA ELECTRONICS TECHNOLOGY INSTITUTE, Seongnam-si, Gyeonggi-do (KR)

(72) Inventors: Choong Sang Cho, Seongnam-si (KR); Young Han Lee, Yongin-si (KR)

(73) Assignee: KOREA ELECTRONICS TECHNOLOGY INSTITUTE, Gyeonggi-Do (KR)

( * ) Notice: Subject to any disclaimer, the term of this patent is extended or adjusted under 35 U.S.C. 154(b) by 0 days.

(21) Appl. No.: 16/163,860

(22) Filed: Oct. 18, 2018

(65) Prior Publication Data
US 2019/0131948 A1   May 2, 2019

(30) Foreign Application Priority Data
Oct. 31, 2017   (KR) .......................... 10-2017-0143038

(51) Int. Cl.
| | | |
|---|---|---|
| H03G 3/30 | (2006.01) | |
| H03G 3/32 | (2006.01) | |
| H03G 7/00 | (2006.01) | |

(52) U.S. Cl.
CPC .......... *H03G 3/3026* (2013.01); *H03G 3/3005* (2013.01); *H03G 3/3089* (2013.01); *H03G 3/32* (2013.01); *H03G 7/002* (2013.01)

(58) Field of Classification Search
CPC .......... H03G 3/3026; H03G 3/20; H03G 3/24; H03G 3/3005; H03G 3/32; H04R 2430/01
See application file for complete search history.

(56) References Cited

U.S. PATENT DOCUMENTS

| | | | | |
|---|---|---|---|---|
| 4,351,983 A | * | 9/1982 | Crouse | ..................... G10L 25/78 704/233 |
| 2016/0049915 A1 | * | 2/2016 | Wang | ................... H03G 3/3089 381/107 |
| 2017/0034362 A1 | * | 2/2017 | Liu | ......................... H04M 1/725 |

FOREIGN PATENT DOCUMENTS

| | | |
|---|---|---|
| KR | 10-2016-0145730 A | 12/2016 |
| KR | 10-2017-0031796 A | 3/2017 |

OTHER PUBLICATIONS

Office Action of corresponding Korean Patent Application No. 10-2017-0143038—6 pages (dated Oct. 6, 2018).

* cited by examiner

*Primary Examiner* — James K Mooney
(74) *Attorney, Agent, or Firm* — Knobbe Martens Olson & Bear LLP

(57) ABSTRACT

The present disclosure relates to a method and system for controlling loudness of an audio based on signal analysis and deep learning. The method includes analyzing an audio characteristic in a frame level based on signal analysis, analyzing the audio characteristic in the frame level based on learning, and controlling loudness of the audio in the frame level, by combining the analysis results. Accordingly, reliability of audio characteristic analysis can be enhanced and audio loudness can be optimally controlled.

5 Claims, 4 Drawing Sheets

AUDIO LOUDNESS CONTROL METHOD AND SYSTEM BASED ON SIGNAL ANALYSIS AND DEEP LEARNING

CROSS-REFERENCE TO RELATED APPLICATION

The present application claims the benefit under 35 U.S.C. § 119(a) to a Korean patent application filed in the Korean Intellectual Property Office on Oct. 31, 2017, and assigned Serial No. 10-2017-0143038, the entire disclosure of which is hereby incorporated by reference.

TECHNICAL FIELD

The present disclosure relates generally to audio signal processing technology, and more particularly, to a method and a system for automatically controlling loudness of an audio of a broadcast content.

BACKGROUND

FIG. 1 is a view illustrating a related-art auto audio loudness control system. The related-art audio loudness control system includes a loudness (LD) measurement unit 10 and an LD controller 20 as shown in FIG. 1.

The LD measurement unit 10 measures loudness of an inputted audio through signal analysis, and the LD controller 20 compares the loudness measured by the LD measurement unit 10 and target loudness, and automatically controls the loudness of the inputted audio.

However, when an audio signal has an unusual characteristic, the audio characteristic may not exactly be grasped through signal analysis, and this results in inappropriate control of loudness.

Therefore, there is a demand for a method for optimally controlling loudness by appropriately analyzing characteristics of various audio signals.

SUMMARY

To address the above-discussed deficiencies of the prior art, it is a primary aspect of the present disclosure to provide a method and a system for controlling loudness of an audio based on signal analysis and deep learning, as a method for increasing reliability of audio characteristic analysis and for optimally controlling loudness of the audio.

According to an embodiment of the present disclosure to achieve the above-described aspects, a method for controlling loudness of an audio includes: a first analysis step of analyzing an audio characteristic in a frame level based on signal analysis; a second analysis step of analyzing the audio characteristic in the frame level based on learning; and a step of controlling loudness of the audio in the frame level, by combining a result of analyzing at the first analysis step and a result of analyzing at the second analysis step.

A type of the audio frame characteristic analyzed at the second analysis step may be more diverse than a type of the audio frame characteristic analyzed at the first step.

The audio frame characteristic analyzed at the first analysis step may include loudness and silence.

The first analysis step may compare the loudness of the audio frame with a threshold, and may divide the audio frame characteristic into a voice and silence.

The threshold may be variable according to audio data.

The audio frame characteristic analyzed at the second analysis step may include a foreground sound, a background sound, and silence.

The step of controlling may include the steps of: determining importance of frames forming the audio by combining the result of analyzing at the first analysis step and the result of analyzing at the second analysis step; and adjusting levels of loudness of the frames based on the determined importance.

In addition, the step of adjusting may include the steps of: determining weights of the frames based on the determined importance; smoothing the determined weights; and determining the levels of loudness of the frames based on the smoothed weights.

The step of controlling may include the steps of: measuring loudness of an outputted audio; and additionally adjusting levels of loudness of the frames based on the measured loudness and target loudness.

According to another embodiment of the present disclosure, a system for controlling loudness of an audio includes: a first analysis unit configured to analyze an audio characteristic in a frame level based on signal analysis; a second analysis unit configured to analyze the audio characteristic in the frame level based on learning; and a controller configured to control loudness of the audio in the frame level, by combining a result of analyzing at the first analysis unit and a result of analyzing at the second analysis unit.

According to still another embodiment of the present disclosure, a method for controlling loudness of an audio includes: a step of receiving an audio; a first analysis step of analyzing an audio characteristic of the inputted audio in a frame level based on signal analysis; a second analysis step of analyzing the audio characteristic of the inputted audio in the frame level based on learning; and a step of controlling loudness of the audio in the frame level, by combining a result of analyzing at the first analysis step and a result of analyzing at the second analysis step.

According to yet another embodiment of the present disclosure, a system for controlling loudness of an audio includes: an input unit configured to receive an audio; a first analysis unit configured to analyze an audio characteristic of the inputted audio in a frame level based on signal analysis; a second analysis unit configured to analyze the audio characteristic of the inputted audio in the frame level based on learning; and a controller configured to control loudness of the audio in the frame level, by combining a result of analyzing at the first analysis unit and a result of analyzing at the second analysis unit.

According to embodiments of the present disclosure as described above, by controlling audio loudness based on signal analysis and deep learning, reliability of audio characteristic analysis can be enhanced and loudness of an audio can be optimally controlled.

In particular, according to embodiments of the present disclosure, regarding an audio which has an unusual characteristic and thus is not appropriate to exactly grasp characteristics only through signal analysis, loudness can be appropriately controlled by exactly grasping characteristics.

Other aspects, advantages, and salient features of the invention will become apparent to those skilled in the art from the following detailed description, which, taken in conjunction with the annexed drawings, discloses embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Hereinafter, the present disclosure will be described in more detail with reference to the accompanying drawings.

Figure 1:
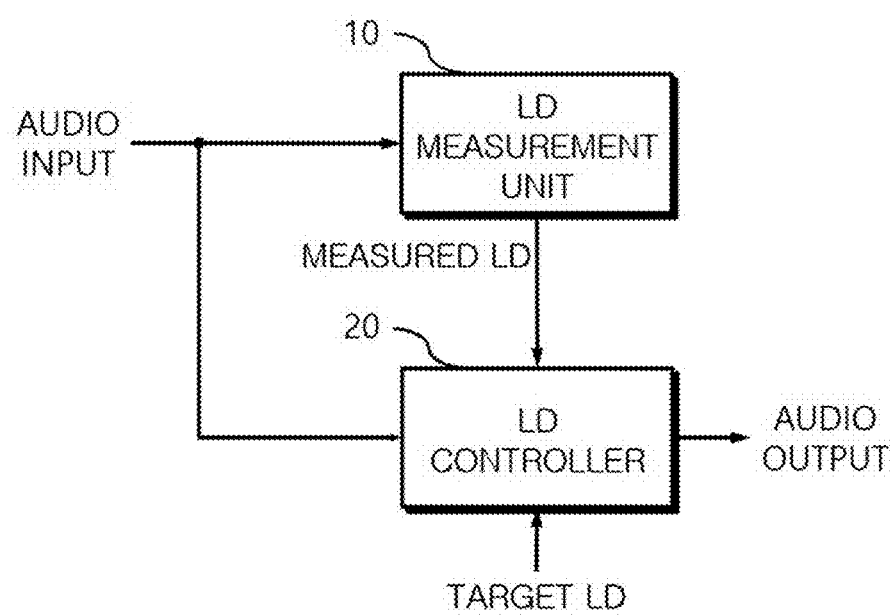
FIG. 1 is a view illustrating a related-art auto audio loudness control system.
Figure 2:
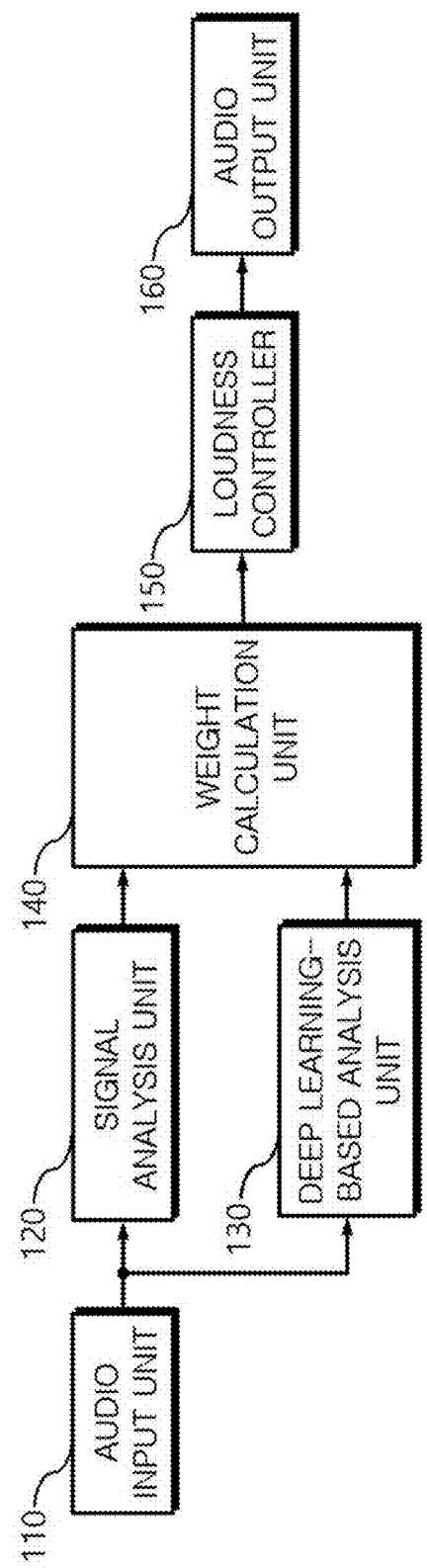
FIG. 2 is a block diagram of an audio loudness control system according to an embodiment of the present disclosure.

FIG. 2 is a block diagram of an audio loudness control system according to an embodiment of the present disclosure. The audio loudness control system according to an embodiment grasps audio characteristics based on signal analysis and deep learning, and controls the loudness of audio based on the grasped audio characteristics. Generally, machine learning uses algorithms to parse data, learn from that data, and make informed decisions based on what it has learned. Deep learning is a subset of machine learning. A deep learning model is designed to continually analyze data with a logic structure similar to how a human would draw conclusions. To achieve this, deep learning uses a layered structure of algorithms called an artificial neural network (ANN). The design of an ANN is inspired by the biological neural network of the human brain. This makes for machine intelligence that is far more capable than that of standard machine learning models.

The audio loudness control system performing such a function according to an embodiment includes an audio input unit 110, a signal analysis unit 120, a deep learning-based analysis unit 130, a weight calculation unit 140, a loudness controller 150, and an audio output unit 160, as shown in FIG. 2.

The audio input unit 110 is a means for receiving an audio signal (audio data) via broadcasting, a network, an external device, a recording medium, or the like.

The signal analysis unit 120 analyzes the audio signal inputted through the audio input unit 110, and analyzes audio characteristics in a frame level.

The signal analysis unit 120 may divide frames of the input audio into loudness frames and silence frames through signal analysis. The loudness frames are frames containing a voice, music, or the like, and the silence frames are the other frames.

Figure 3:
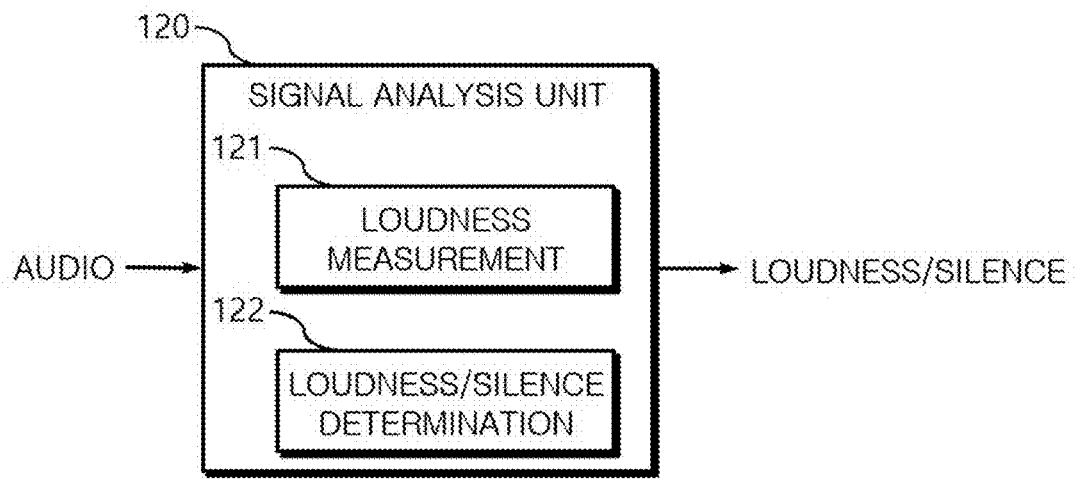
FIG. 3 is a view provided to explain a signal analysis unit of FIG. 2 in detail.

To achieve this, the signal analysis unit 120 measures levels of loudness of the inputted audio frames (121), and compares the measured loudness levels with a threshold, and divides the audio frames into loudness frames and silence frames (122), as shown in FIG. 3.

In measuring loudness at "121," the signal analysis unit 120 measures momentary, short, integrates loudness through audio signal analysis. In determining loudness/silence at "122," the signal analysis unit 120 may determine a loudness frame when the measured loudness exceeds the threshold, and may determine a silence frame when the measured loudness is less than or equal to the threshold. In embodiments, the signal analysis unit 120 analyze an input audio data using a signal analysis technique that is not based on a deep-learning technique (and accordingly different from a signal analysis technique used by the deep learning-based analysis unit 130).

Herein, the threshold may be variable. For example, the threshold may be variable according to the genre of audio, and it means that a different threshold may be applied according to the genre of audio. The genre of audio may be grasped by the deep learning-based analysis unit 130, which will be described below.

The deep learning-based analysis unit 130 may analyze the audio signal inputted through the audio input unit 110 based on deep learning, and may analyze audio characteristics in a frame level. By doing so, the deep learning-based analysis unit 130 may divide the frames of the input audio into a foreground sound frame, a background sound frame, and a silence frame.

The foreground sound frame refers to a frame which gives more weight to a sound set as a foreground sound, for example, a voice, the background sound frame refers to a frame which gives more weight to a sound set as a background sound, for example, music, an ambient noise, etc., and the silence frame refers to a frame except for the foreground sound frame and the background sound frame, that is, a frame having a very low level of loudness.

In addition, the deep learning-based analysis unit 130 analyzes what the genre of audio inputted through the audio input unit 110 is.

The audio characteristics grasped by the deep learning-based analysis unit 130 through analysis are more diverse and more fragmented than the audio characteristics grasped by the signal analysis unit 120 through analysis.

Figure 4:
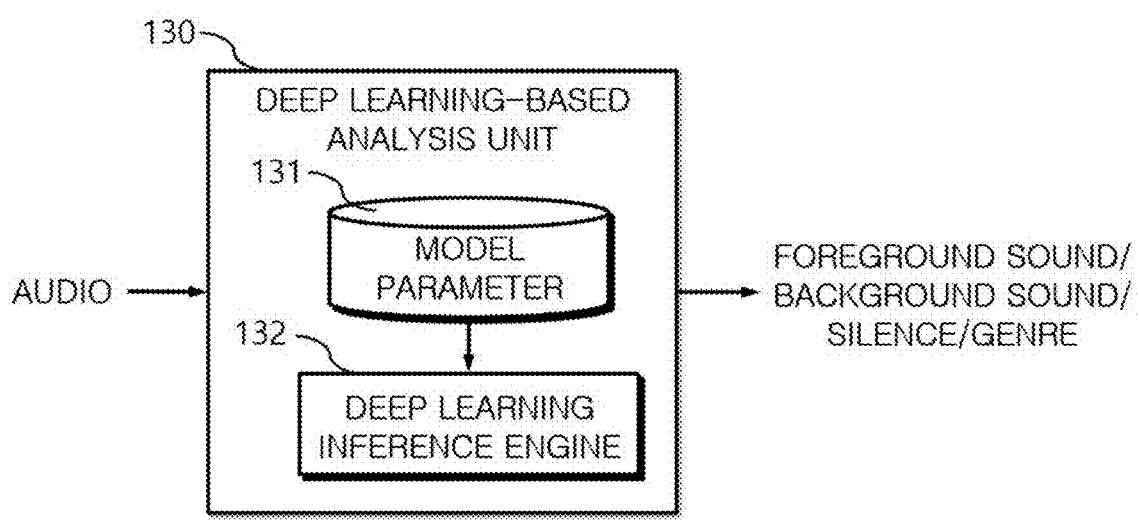
FIG. 4 is a view provided to explain a deep learning-based analysis unit of FIG. 2 in detail.

To achieve this, the deep learning-based analysis unit 130 uses a previously trained model parameter 131 and a deep learning inference engine 132 for outputting characteristic information regarding the inputted audio with reference to the model parameter 131 as shown in FIG. 4.

The weight calculation unit 140 determines importance of the frames forming the audio by combining a result of analyzing at the signal analysis unit 120 and a result of analyzing at the deep learning-based analysis unit 130.

For example, the weight calculation unit 140 may set importance of an audio frame that is analyzed as a loudness frame at the signal analysis unit 120, and is analyzed as a foreground sound frame at the deep learning-based analysis unit 130, to "high," may set importance of an audio frame that is analyzed as a loudness frame at the signal analysis unit 120, and is analyzed as a background sound frame at the deep-learning-based analysis unit 130, to "middle high,"

may set importance of an audio frame that is analyzed as a silence frame at the signal analysis unit 120, and is analyzed as a background sound frame at the deep learning-based analysis unit 130, to "middle low," and may set importance of an audio frame that is analyzed as a silence frame both at the signal analysis unit 120 and the deep learning-based analysis unit 130, to "low."

In addition, the weight calculation unit 140 determines weights regarding the audio frames based on the determined importance.

For example, the weight calculation unit 140 may determine a weight of the audio frame of importance of "high" to "1.3," may determine a weight of the audio frame of importance of "middle high" to "1.1," may determine a weight of the audio frame of importance of "middle low" to "0.9," and may determine a weight of the audio frame of importance of "low" to "0.7."

Next, the weight calculation unit 140 smooths the determined weights along a time axis. Specifically, the weight calculation unit 140 may smooth the weights according to a moving average technique.

This technique refers to smoothing the weight of a current audio frame by averaging the weight of the current frame, weights of n number of previous frames, and weights of n number of next frames with reference to the current audio frame, as shown in the following equation. As shown in the equation, a weight w ( ) may be applied to a weight a ( ) of each audio frame, and a high weight w ( ) is implemented for an audio frame adjacent to the current audio frame.

$$W_n(t) = \frac{\sum_{i=-n}^{n} a(i+n) \times w(i)}{2n+1}$$

The loudness controller 150 controls levels of loudness of the audio frames by using the smoothed weights outputted from the weight calculation unit 140. The loudness of the audio frame having high importance is increased, and the loudness of the audio frame having low importance is reduced.

The audio output unit 160 outputs the audio the loudness of which is controlled by the loudness controller 150.

The loudness controller 150 may measure the loudness of the audio outputted from the audio output unit 160, and may limit the levels of loudness of the audio frames based on the measured output loudness.

The levels of loudness of the audio frames may be limited when an average of output loudness for a predetermined time exceeds target loudness or exceeds for remaining time.

Figure 5:
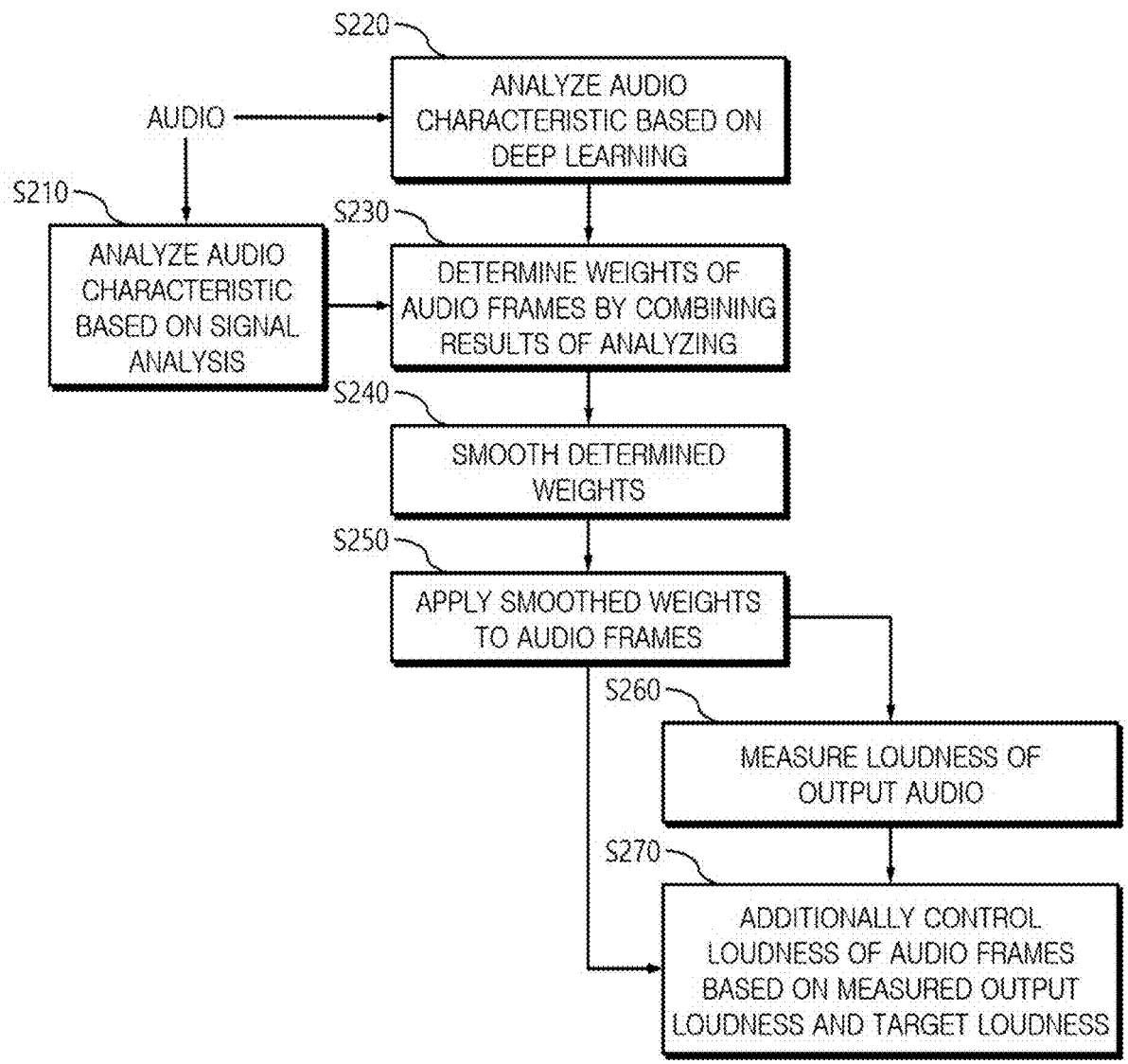
FIG. 5 is a flowchart provided to explain an audio loudness control method according to another embodiment of the present disclosure.

Hereinafter, a process of controlling loudness of an audio by the system illustrated in FIG. 2 will be described in detail with reference to FIG. 5. FIG. 5 is a flowchart provided to explain a method for controlling loudness of an audio according to another embodiment.

To control loudness of an audio, the signal analysis unit 120 may analyze an audio signal inputted through the audio input unit 110, and may analyze audio characteristics in a frame level (S210).

In addition, the deep learning-based analysis unit 130 analyzes the audio signal inputted through the audio input unit 110 based on deep learning, and analyzes the audio characteristics in the frame level (S220).

Then, the weight calculation unit 140 may determine importance of each frame forming the audio by combining a result of analyzing at step S210 and a result of analyzing at step S220, and may determine weights regarding the audio frames (S230).

Next, the weight calculation unit 140 smooths the weights determined at step S230 along a time axis (S240).

In addition, the loudness controller 150 may apply the weights smoothed at step S240 to the inputted audio frames, and may control levels of loudness of the audio frames, respectively (S250).

The loudness controller 150 may measure the loudness of the audio outputted through the audio output unit 160 (S260), and may additionally control the levels of loudness of the audio frames based on the measured output loudness and target loudness (S270).

The technical concept of the present disclosure may be applied to a computer-readable recording medium which records a computer program for performing the apparatus and the method according to embodiments of the present disclosure. In addition, the technical concept according to various embodiments of the present disclosure may be implemented in the form of a computer-readable code recorded on a computer-readable recording medium. The computer-readable recording medium may be any data storage device from which data can be read by a computer and which can store data. For example, the computer-readable recording medium may be a read only memory (ROM), a random access memory (RAM), a CD-ROM, a magnetic tape, a floppy disk, an optical disk, a hard disk drive, or the like. A computer-readable code or program that is stored in the computer-readable recording medium may be transmitted via a network connected between computers.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

In addition, while embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical idea or prospect of the present disclosure.

What is claimed is:

1. A method of controlling a loudness of an audio signal that comprises one or more frames, the method comprising:
   analyzing, at a computing device comprising one or more processors, a first frame of the audio signal using a deep-learning based analysis unit of the computing device, to determine a genre of the audio signal and to determine a reference loudness based on the genre;
   analyzing, at the computing device, the first frame of the audio signal using a non- deep-learning based analysis technique to measure a loudness of the first frame;
   determining a first category of the first frame based on the loudness measured using the non-deep-learning based analysis technique and the reference loudness determined using the deep-learning based analysis unit of the computing device, wherein the first category indicates that the first frame is a voice frame when the measured loudness is greater than the reference loudness, and wherein the first category indicates that the first frame is a silence frame when the measured loudness is less than the reference loudness;

analyzing, at the computing device, the first frame of the audio signal using the deep-learning based analysis to obtain unit of the computing device to obtain a second category of the first frame, wherein the second category indicates that the first frame is a foreground sound frame, a background sound frame, or a silence frame;

determining, at the computing device, an importance level of the first frame based on a combination of the first category and the second category, wherein the importance level of the first frame is higher in the combination of the first frame being the voice frame in the first category and the foreground sound frame in the second category than in the combination of the first frame being the voice frame in the first category and the background sound frame in the second category, and wherein the importance level of the first frame is higher in the combination of the first frame being the voice frame in the first category and the background sound frame in the second category than in the combination of the first frame being the silence frame in the first category and the background sound frame in the second category;

determining, at the computing device, an adjusted loudness of the first frame according to the determined importance level of the first frame such that the higher the importance level, the louder the first frame; and causing the computing device to generate an audio output based on the adjusted loudness of the first frame.

2. The method of claim 1, wherein the second category indicates that the first frame is a foreground sound frame when a voice signal outweighs a noise signal in the first frame.

3. The method of claim 1, wherein the second category indicates that the first frame is a background sound frame when a noise signal outweighs a voice signal in the first frame.

4. The method of claim 1, further comprising:
measuring a loudness of the audio output; and
additionally adjusting a loudness of the one or more frames of the audio signal when an average of the measured loudness exceeds a predetermined target loudness.

5. A system for controlling a loudness of an audio signal that comprises one or more frames, the system comprising:
at least one processor; and
at least one memory storing instructions, the instructions configured to cause the at least one processor to perform:

analyzing a first frame of the audio signal using a deep-learning based analysis unit of the at least one processor to determine a genre of the audio signal and to determine a reference loudness based on the genre;

analyzing the first frame of the audio signal using a non-deep-learning based analysis technique to measure a loudness of the first frame;

determining a first category of the first frame based on the loudness measured using the non-deep-learning based analysis technique and the reference loudness determined using the deep-learning based analysis unit of the at least one processor, wherein the first category indicates that the first frame is a voice frame when the measured loudness is greater than the reference loudness, and wherein the first category indicates that the first frame is a silence frame when the measured loudness is less than the reference loudness;

analyzing the first frame of the audio signal using the deep-learning based analysis unit of the at least one processor to obtain a second category of the first frame, wherein the second category indicates that the first frame is a foreground sound frame, a background sound frame, or a silence frame;

determining an importance level of the first frame based on a combination of the first category and the second category, wherein the importance level of the first frame is higher in the combination of the first frame being the voice frame in the first category and the foreground sound frame in the second category than in the combination of the first frame being the voice frame in the first category and the background sound frame in the second category, and wherein the importance level of the first frame is higher in the combination of the first frame being the voice frame in the first category and the background sound frame in the second category than in the combination of the first frame being the silence frame in the first category and the background sound frame in the second category;

determining an adjusted loudness of the first frame according to the determined importance level of the first frame such that the higher the importance level, the louder the first frame; and causing to generate an audio output based on the adjusted loudness of the first frame.

* * * * *